United States Patent
Mukhopadhyay et al.

(10) Patent No.: US 9,659,844 B2
(45) Date of Patent: May 23, 2017

(54) SEMICONDUCTOR DIE SUBSTRATE WITH INTEGRAL HEAT SINK

(71) Applicant: Texas Instruments Incorporated, Dallas, TX (US)

(72) Inventors: Rajarshi Mukhopadhyay, Allen, TX (US); Daniel N. Carothers, Lucas, TX (US); Benjamin Cook, Rockwall, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 14/841,081

(22) Filed: Aug. 31, 2015

(65) Prior Publication Data

US 2017/0062316 A1     Mar. 2, 2017

(51) Int. Cl.
| | |
|---|---|
| *H01L 23/48* | (2006.01) |
| *H01L 23/495* | (2006.01) |
| *H01L 23/367* | (2006.01) |
| *H01L 23/31* | (2006.01) |
| *H01L 21/48* | (2006.01) |

(52) U.S. Cl.
CPC .... *H01L 23/49568* (2013.01); *H01L 21/4828* (2013.01); *H01L 21/4882* (2013.01); *H01L 23/3157* (2013.01); *H01L 23/367* (2013.01); *H01L 23/4952* (2013.01); *H01L 23/49575* (2013.01); *H01L 23/49579* (2013.01)

(58) Field of Classification Search
CPC .............. G01R 31/26; H01L 23/49568; H01L 23/49579; H01L 23/4952; H01L 23/367; H01L 23/3157; H01L 23/49575; H01L 21/4828; H01L 21/4882

USPC ....... 257/737, 738, 778, 734, 668, 773, 774, 257/775, 776
See application file for complete search history.

(56) References Cited

U.S. PATENT DOCUMENTS

| | | | |
|---|---|---|---|
| 4,893,174 A | 1/1990 | Yamada et al. | |
| 6,362,436 B1* | 3/2002 | Kimbara | H01L 23/13 174/256 |
| 6,607,928 B1* | 8/2003 | Eiles | H01L 23/3677 257/E23.105 |
| 2002/0063330 A1* | 5/2002 | Macris | H01L 23/38 257/712 |
| 2005/0077614 A1* | 4/2005 | Chengalva | H01L 23/42 257/706 |

(Continued)

FOREIGN PATENT DOCUMENTS

| | | |
|---|---|---|
| JP | 03165547 A | 7/1991 |
| JP | 2002246514 A | 8/2002 |

(Continued)

OTHER PUBLICATIONS

International Search Report for PCT/US2016/049679 mailed Dec. 1, 2016.

*Primary Examiner* — Alexander Oscar Williams
(74) *Attorney, Agent, or Firm* — John R. Pessetto; Charles A. Brill; Frank D. Cimino

(57) ABSTRACT

An integrated circuit device includes a semiconductor substrate with a top surface, a bottom surface opposite the top surface and an intermediate portion positioned between the top and bottom surfaces. The device also includes interior substrate surfaces defined by at least one void extending from the bottom surface to the intermediate portion.

24 Claims, 8 Drawing Sheets

(56) References Cited

U.S. PATENT DOCUMENTS

| | | | |
|---|---|---|---|
| 2006/0027934 A1* | 2/2006 | Edelstein | H01L 21/486 257/774 |
| 2006/0131596 A1* | 6/2006 | Ouderkirk | H01L 33/60 257/98 |
| 2006/0131601 A1* | 6/2006 | Ouderkirk | H01L 33/60 257/99 |
| 2007/0205792 A1* | 9/2007 | Mouli | H01L 23/367 324/750.09 |
| 2009/0045512 A1* | 2/2009 | Hedler | H01L 21/486 257/738 |
| 2010/0063185 A1* | 3/2010 | Morita | H01L 23/296 524/109 |
| 2010/0164093 A1* | 7/2010 | Mowry | H01L 23/3677 257/706 |
| 2012/0161190 A1* | 6/2012 | Yao | H01L 23/3677 257/99 |
| 2013/0001758 A1 | 1/2013 | Moersheim et al. | |

FOREIGN PATENT DOCUMENTS

| | | |
|---|---|---|
| JP | 2003258165 A | 9/2003 |
| JP | 2006332374 A | 12/2006 |
| WO | 2013097580 A1 | 4/2013 |

* cited by examiner

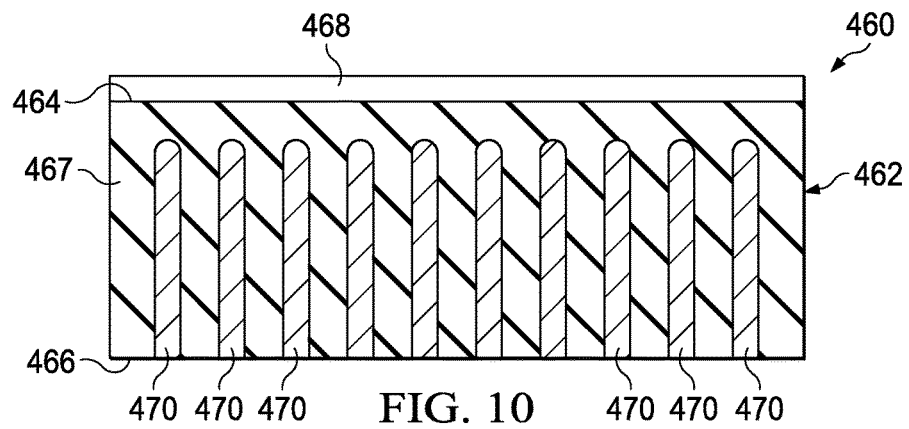
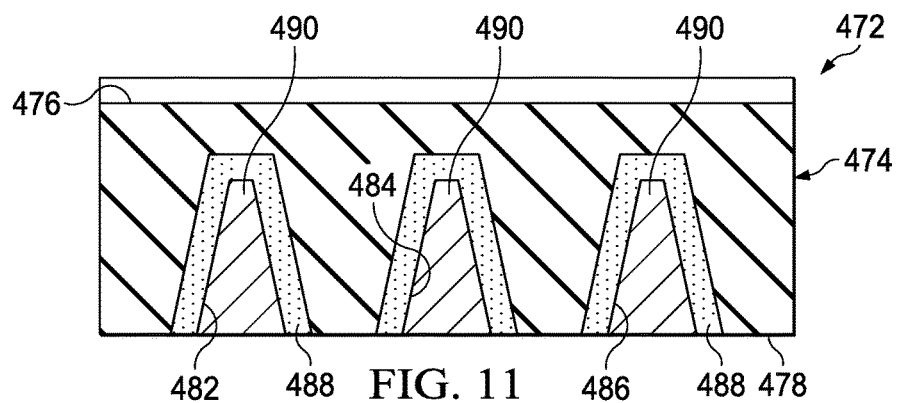
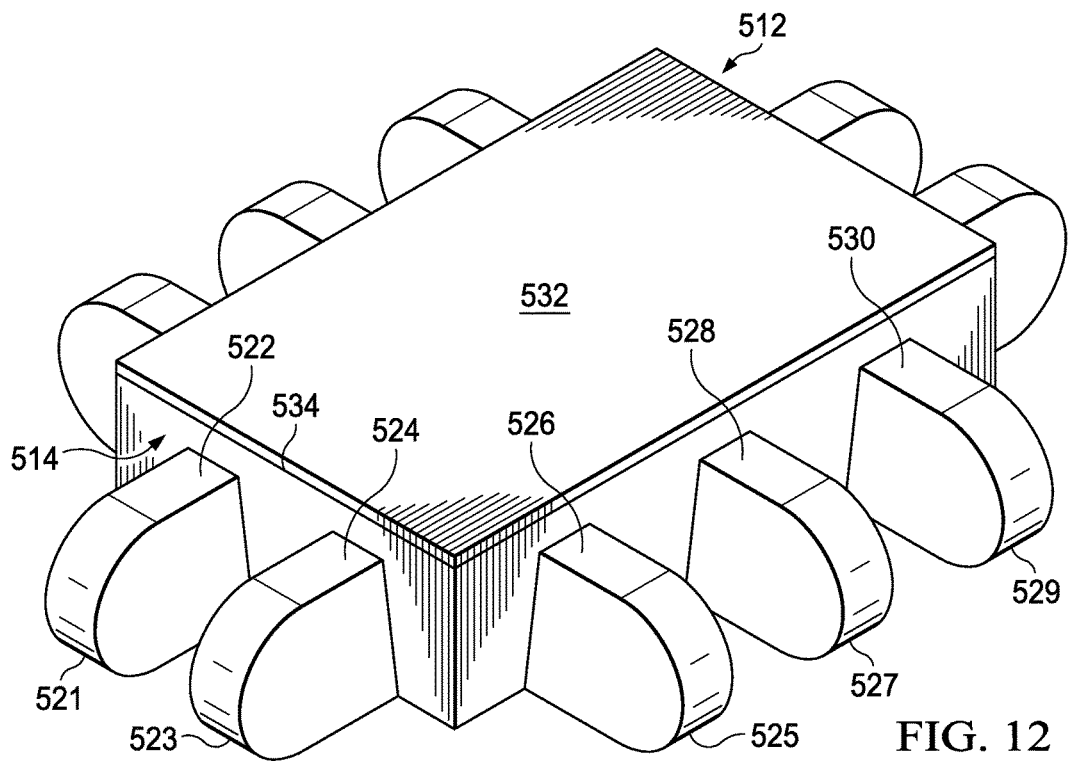

910 — ETCHING AT LEAST ONE VOID IN A SUBSTRATE

FIG. 17

920 — ETCHING AT LEAST ONE VOID IN A SUBSTRATE

922 — AT LEAST PARTIALLY FILLING THE AT LEAST ONE VOID WITH THERMALLY CONDUCTIVE MATERIAL

FIG. 18

932 — ETCHING AT LEAST ONE VOID IN A SUBSTRATE

934 — INKJET PRINTING THERMALLY CONDUCTIVE MATERIAL IN THE AT LEAST ONE VOID

FIG. 19

SEMICONDUCTOR DIE SUBSTRATE WITH INTEGRAL HEAT SINK

BACKGROUND

An integrated circuit (IC) die typically includes a substrate of semiconductor material, such as silicon, with a flat top surface and an opposite flat bottom surface. A metal circuit layer is usually provided only on the top surface of the semiconductor substrate. The circuit layer generates heat when the die is operating. Various techniques have been used to dissipate the heat generated by the metal circuit layer. Typically only a very small portion of the heat from the circuit layer is dissipated through the semiconductor substrate because semiconductors are poor heat conductors.

SUMMARY

One embodiment of an integrated circuit device includes a semiconductor substrate with a top surface, a bottom surface opposite said top surface and an intermediate portion positioned between the top and bottom surfaces. The device also includes interior substrate surfaces defined by at least one void extending from the bottom surface to the intermediate portion.

One embodiment of an integrated circuit package includes a lead frame with a die pad and a plurality of leads. A first semiconductor die substrate is attached at a bottom surface thereof to the die pad. The first semiconductor substrate has a plurality of slots extending through it laterally. The slots have openings at the bottom surface of the first semiconductor die substrate. A first clip member is attached at one end to a metal circuit layer on the top of the first semiconductor die substrate and on the other end to at least one of the plurality of leads. A second semiconductor die substrate is attached at a bottom surface thereof to the first clip member. The second semiconductor die substrate has a plurality of slots extending through it laterally. The slots have openings at the bottom surface of the second semiconductor die substrate. A second clip member is attached at one end to a metal circuit layer on the top of the second die and on the other end to at least one of the plurality of leads.

One embodiment of a method of forming an integrated circuit die includes etching at least one void in a substrate.

BRIEF DESCRIPTION OF THE DRAWINGS

FIG. 10 is a cross-sectional elevation view of an example embodiment of an IC die with an integral heat sink formed by narrow width slots filled with thermally conductive material.

FIG. 11 is a cross-sectional elevation view of an example embodiment of an IC die with an integral heat sink in which heat sink voids are filled with two different thermally conductive materials.

FIG. 12 is an isometric view of an example embodiment of an IC die with heat sink slots filled with thermally conductive material that projects outwardly from the IC die.

FIG. 17 is a flowchart of one example method of forming an integrated circuit die.

FIG. 18 is a flowchart of another example method of forming an integrated circuit die.

FIG. 19 is a flowchart of yet another example method of forming an integrated circuit die.

DETAILED DESCRIPTION

Figure 1:
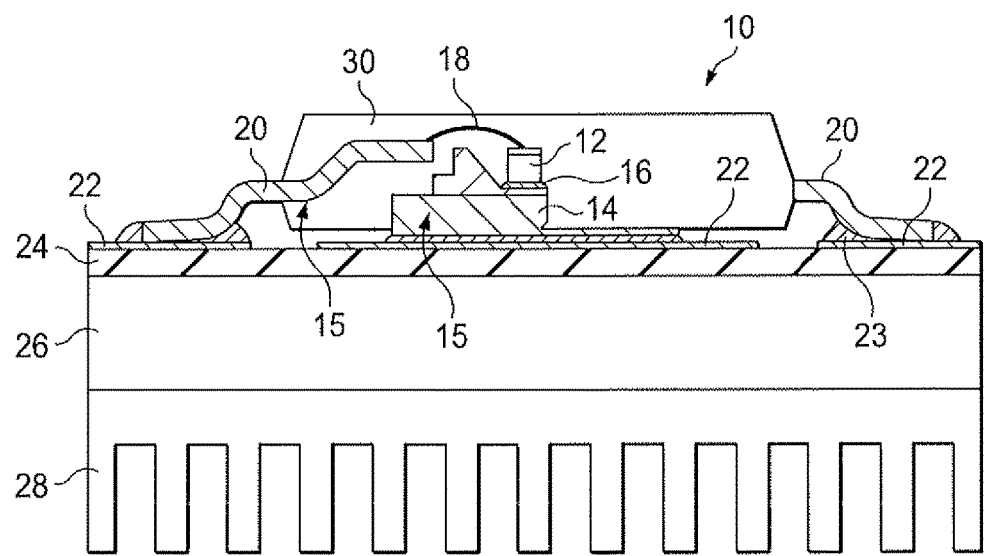
FIG. 1 is a partially cross-sectional elevation view of a prior art integrated circuit (IC) package and heat sink assembly.

FIG. 1 is a partially cross-sectional elevation view of a prior art integrated circuit (IC) package and heat sink assembly 10. An IC die 12 is attached to a die attach pad 14 of a leadframe 15 with die attach adhesive 16. A bond wire 18 is solder attached to a contact surface of the IC die 12 at one end and is solder attached to a leadframe lead 20 at the other end. The leads 20 are attached to solder pads 22 with solder 23. The solder pads 22 are provided on a dielectric layer 24 that is in turn attached to the top surface of an aluminum plate 26. The aluminum plate 26 acts as a heat sink and has a slotted bottom portion 28 that acts as a heat radiator. A layer of mold compound 30 encapsulates the die 12, the bond wire 18, and portions of the lead frame. Heat generated by the die 12 passes from the die 12 to the die pad 14 and leads 20 and thereafter through the dielectric layer 24 to the aluminum plate 26. Heat is transferred from the aluminum plate to the atmosphere.

Figure 2:
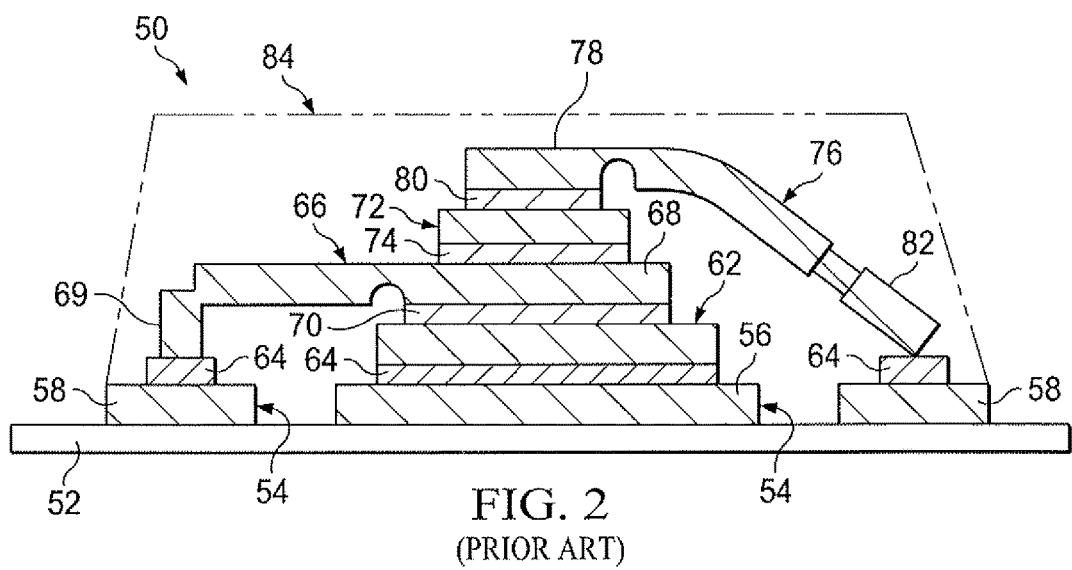
FIG. 2 is a cross-sectional elevation view of a prior art IC package with stacked IC dies.

FIG. 2 illustrates another prior art integrated circuit package known as a stacked die package 50. The stacked die package 50 in FIG. 2 is mounted on an electrical substrate such as a PC (printed circuit) board 52. Stacked die package 50 includes a lead frame 54 that has a central die attach pad 56 and a plurality of peripherally positioned leads 58. A first die 62, which in this embodiment comprises a FET (field-effect transistor) die, is attached to the die attach pad 56 by a layer of adhesive 64. A first clip 66 has a first portion 68 thereof attached to the top of die 62 by a second layer of adhesive 70. A second portion 69 of the clip 66 is attached to a lead 58 by a portion of the first adhesive layer 64.

A second die 72 is attached to a top portion of the first clip 66 by a third layer of adhesive 74. A second clip 76 has a first portion 78 thereof attached to the top of the second die 72 by a fourth layer of die attach adhesive 80. A second portion 82 of the clip 76 is attached to a lead 58 by a portion of the first adhesive layer 64. A layer of mold compound 84 covers the dies 62, 72 and clips 66, 76 leaving the bottom surfaces of the leads 58 and the die attach pad 56 exposed on the bottom surface of the package. The leads 58 are also exposed on the lateral sides of the package 50.

In the stacked die package 50 heat generated by electric circuitry at the top of die 62 is transferred through the die attach adhesive 72 to the first clip 66 and then through adhesive layer 64 to a lead 58. Heat is also transferred through the body of the die 62 and the first adhesive layer 64 to the die attached pad 56. The heat transferred form the first die 62 then escapes through the exposed surfaces of the die attach pad 56 and leads 58 to the attached PC board 52 and atmosphere. Heat is transferred from the electrical circuitry at the top of the second die 72 through adhesive layer 80 to the second clip 76 and then to leads 58. Heat from the second die circuit layer also passes through the second die 72 and adhesive layer 74 to attached first clips 66 and then to the leads 58 and thence out of the package. The amount of heat transferred through the dies 62 and 72 is relatively small because the die substrates are made from semiconductor material, which has poor thermal conductive properties.

Figure 3:
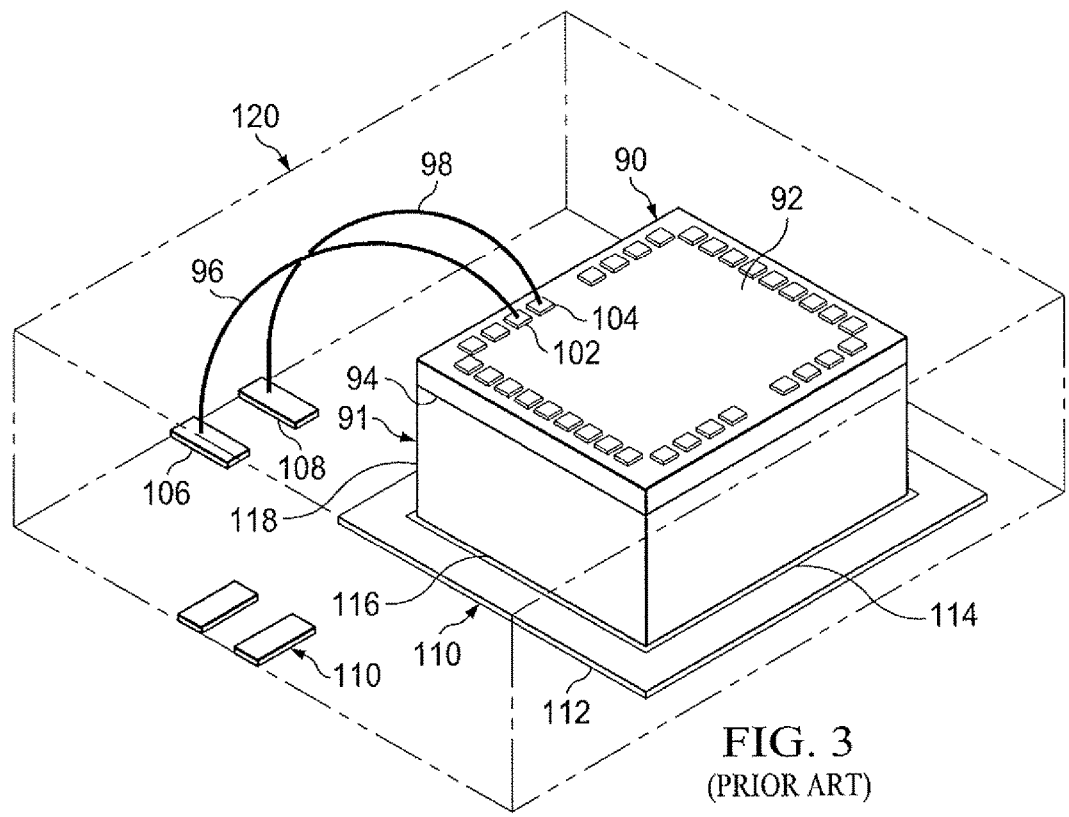
FIG. 3 is an isometric view of another prior art IC package.

FIG. 3 is an isometric view of a prior art IC die 90 having a semiconductor substrate 91. The semiconductor substrate 91 has a metal circuit layer 92 formed on a top surface 94 thereof. Bond wires 96, 98 are attached by solder to contacts 102, 104 on the die metal circuit layer 92. The second ends of bond wires 96, 98 are attached by solder to leads 106, 108. The leads 106, 108 and a die attach pad 112 are portions of a lead frame 110. A bottom side 116 of the semiconductor substrate 91 is attached by solder or adhesive 114 to die attach pad 112. The IC die 90, bond wires 96, 98 and portions of the lead frame 110 are encapsulated in mold compound 120. Heat from the metal circuit layer 92 at the top of the semiconductor substrate 91 passes through an intermediate portion 118 of the substrate 91 to the bottom surface 116 then through die attach material 114 and die attach pad 112 before leaving the encapsulated package 90. Some heat also escapes through the bond wires 96, 98 and attached leads 106, 108.

It will be appreciated from the descriptions of the prior art IC packages in FIGS. 1-3 that in all cases at least a portion of the heat generated by the electrical circuitry at the top portion of a die is transferred to the associated semiconductor substrate that is in physical contact with it. Virtually all semiconductor materials, for example, silicon, are thermal insulators, i.e., poor conductors of thermal energy. Thus, heat transfer through the semiconductor substrate is slow and inefficient. As used herein, the phrases "thermally nonconductive;" "poor heat conductor;" "poor thermal conductor;" "thermal insulator" and similar phrases refer to materials having a thermal conductivity of less than about 0.5 W/mK. Similarly "thermal conductor;" "heat conductor" and similar phrases refer to materials having a thermal conductivity of more than about 5 W/mK. The integrated circuit dies, developed by the inventors and described below, have significantly improved heat transfer through the IC die substrates thereof as compared to prior art IC dies. This improved heat transfer through a die substrate may be particularly advantages in encapsulated integrated circuit package applications.

Figure 4:
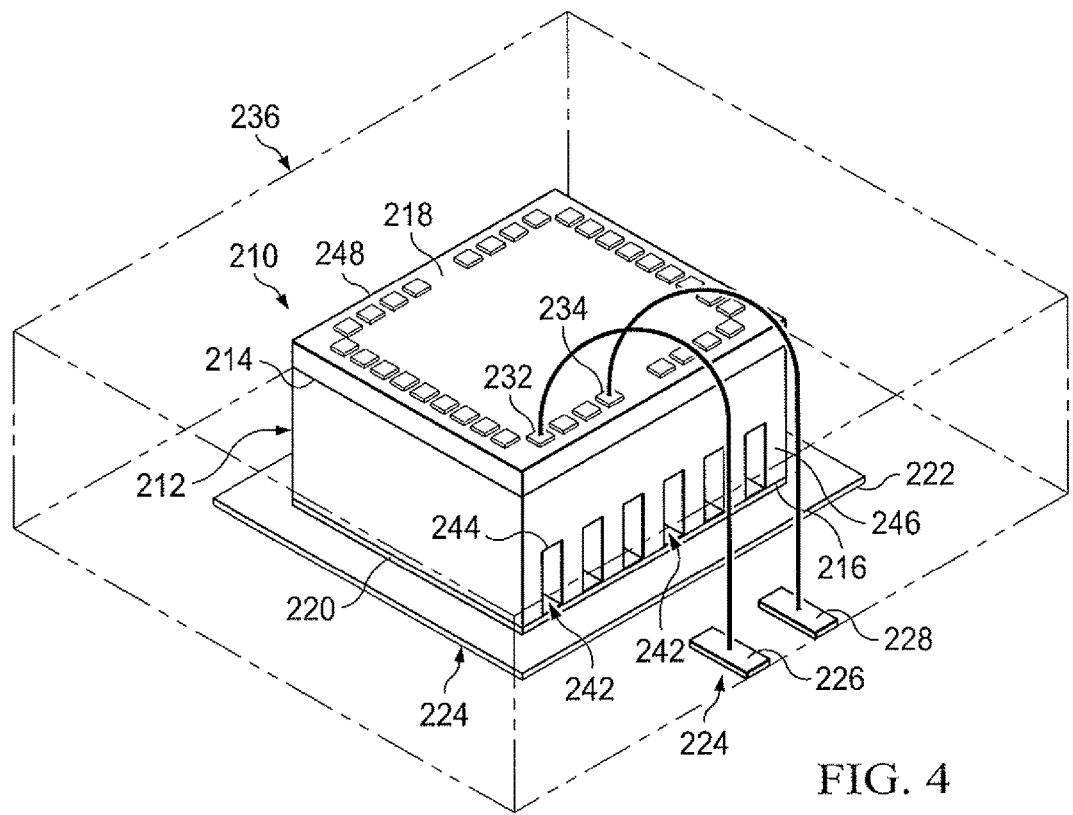
FIG. 4 is an isometric view of an example embodiment of an IC die having an integral heat sink formed by parallel slots.

FIG. 4 is an isometric view of an IC die 210 having an integral heat sink formed therein. The IC die 210 includes a semiconductor substrate 212 with a top (active) side 214 and a bottom side 216. A metal circuit layer 218 is formed on the top side 214. The bottom side 216 is attached by a die attach material 220 such as solder or die adhesive to a die attach pad 222 of a lead frame 224. The leadframe has a plurality of leads 226, 228, etc. Bond wires 232, 234, etc. are attached between leads 226, 228, etc., and contact surfaces 232, 234 on the metal circuit layer 218. A layer of encapsulant 236 encapsulates IC die 210, bond wires 232, 234 and portions of the lead frame 224.

The substrate 212 has a plurality of voids that extend upwardly from the bottom side 216 of the substrate to an intermediate height portion 244 of the substrate. In this embodiment, the voids are parallel longitudinally extending slots 242 that extend from one longitudinal end face 246 of the substrate 212 to the opposite longitudinal end face 248 thereof. By removing semiconductor material from the substrate 212, heat transfer through the substrate is improved. In the embodiment illustrated in FIG. 4, heat transfer is improved because air, which replaces the semiconductor material removed from the slots 242 is a better heat transfer medium than semiconductor material, even though air is a relatively poor heat transfer medium.

Figure 5:
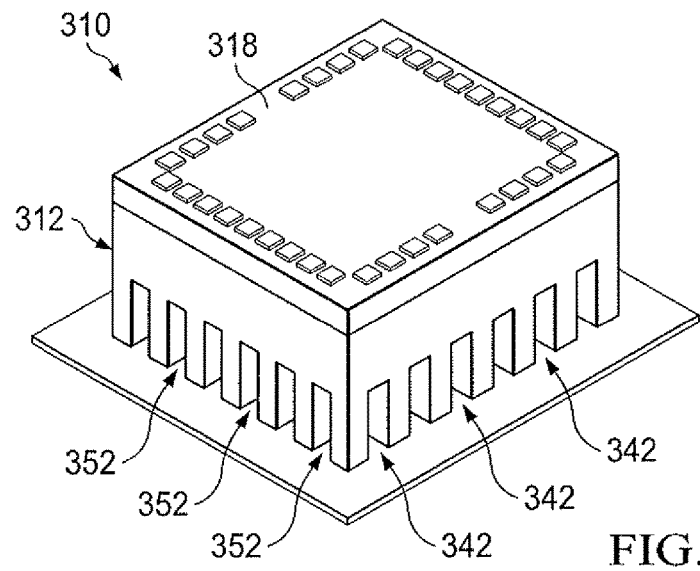
FIG. 5 is an isometric view of an example embodiment of an IC package with an IC die having an integral heat sink formed by intersecting parallel slots.

FIG. 5 is an isometric view of an IC die 310 having and integral heat sink formed by intersecting sets of parallel slots 342, 352, extending through the semiconductor material. The IC die configuration illustrated in FIG. 5, has approximately twice the amount of semiconductor material removed from it and thus has better heat transfer then the semiconductor die 210 illustrated in FIG. 4. The IC die 310 may be part of an integrated circuit package of the same type as shown in FIG. 4. It will be understood that the die 310 of FIG. 5 may be provided in a die package such as shown in FIG. 4.

Figure 6:
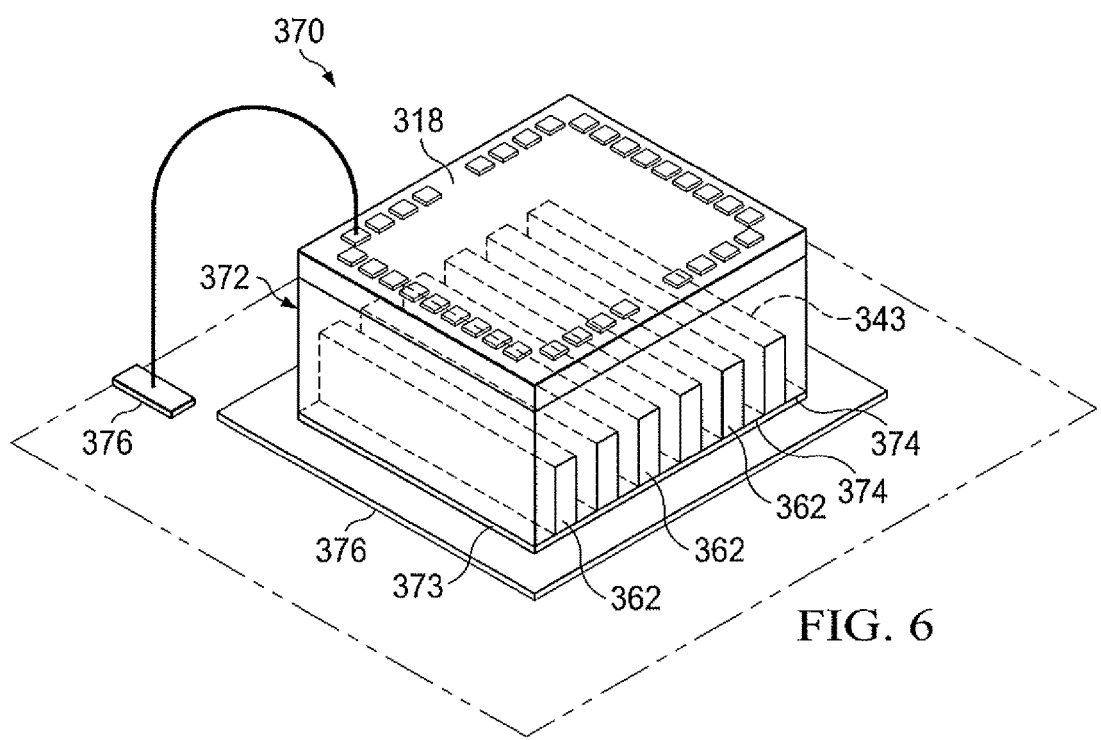
FIG. 6 is an isometric view of an example embodiment of an IC die having integral heat sink formed by parallel slots filled with thermally conductive material.

FIG. 6 is an isometric view of an IC die 370 with semiconductor substrate 372 identical to IC die substrate 212 shown in FIG. 4, except that the slots 366 in substrate 372 are filled with a thermally conductive material 343, such as a graphene, graphite, or other high thermally conductive thin coating to distribute the heat evenly over fins 374. Thermal epoxy material 373 attaches the substrate 372 to a thermal sink (lead frame) 376. The thermally conductive material 343 has superior heat transfer properties to the removed semiconductor material from which the substrate 372 is constructed. The thermally conductive material 343 also has superior heat transfer properties to air that fills slots 242 shown in FIG. 4. Thus, the heat transfer properties of the substrate 372 of die 370 in FIG. 6 are superior to those of the un-slotted substrate 91 of FIG. 3 and are also superior to the slotted substrate 212 with unfilled slots of FIG. 4. The IC die 370 may be part of an integrated circuit package of the same type as shown in FIG. 4.

Figure 7:
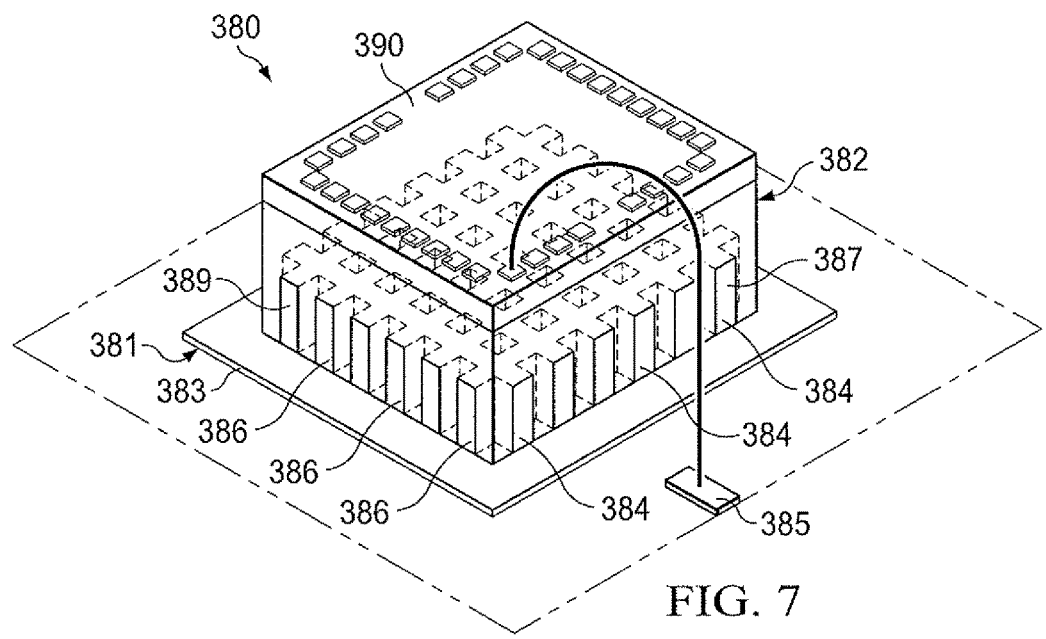
FIG. 7 is an isometric view of an example embodiment of an IC die having an integral heat sink formed by intersecting parallel slots filled with thermally conductive material.

FIG. 7 is an isometric view of IC die 380 with substrate 382 and circuit layer 390 identical to the IC die 310 shown in FIG. 5, except that the longitudinally extending slots 384 and laterally extending slots 386 in the substrate 382 are filled with thermally conductive material 387 and 389, respectively. The die 380 is mounted on a leadframe 381 with a die pad 383 and leads 385 as by an adhesive layer (not shown). Because of the conductive fill material placed in the slots and the greater slot volume, the heat transfer property of the substrate 382 is superior to those of any of the substrates shown in FIGS. 3-6. The IC die 380 may be part of an integrated circuit package of the same type as shown in FIG. 4.

Figure 8:
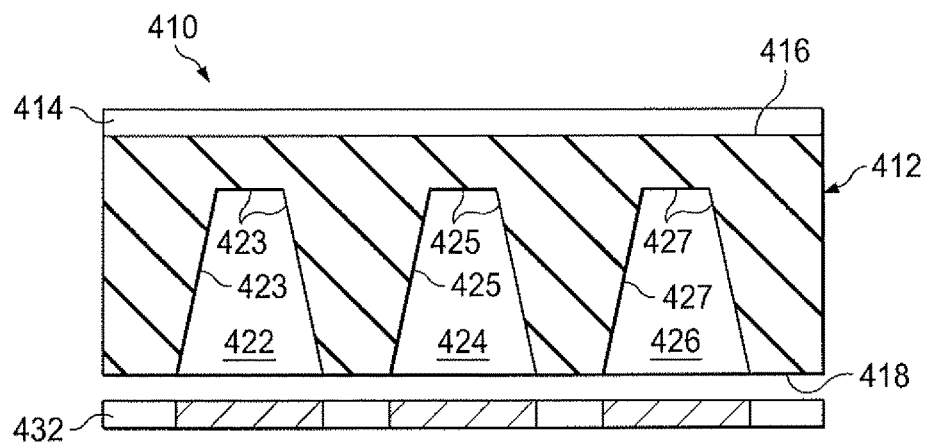
FIG. 8 is a cross-sectional elevation view of an example embodiment of an IC die with an integral heat sink and an associated etch reticle.

FIG. 8 is a cross-sectional elevation view of an IC die 410 with an integral heat sink formed in a semiconductor substrate 412 thereof. The semiconductor substrate 412 has a top surface 416 and a bottom surface 418. A metal circuit layer 414 is positioned on the top surface 416 of the substrate 412. A plurality of generally trapezoidal cross sectional shaped voids or slots 422, 424, 426 extend from one longitudinal end of the die to the other. These voids 422, 424, 426 define corresponding walls 423, 425, 427. An etch reticle 432 is placed over the bottom surface 418 of the die 410, during void formation. The reticle 432 has openings 434, 436, 438 therein corresponding to the voids 422, 424, 426, which are conventionally formed using the reticle. Voids formed in the semiconductor substrates described herein may be conventionally formed either by wet etching or dry etching processes well known in the art.

Figure 9:
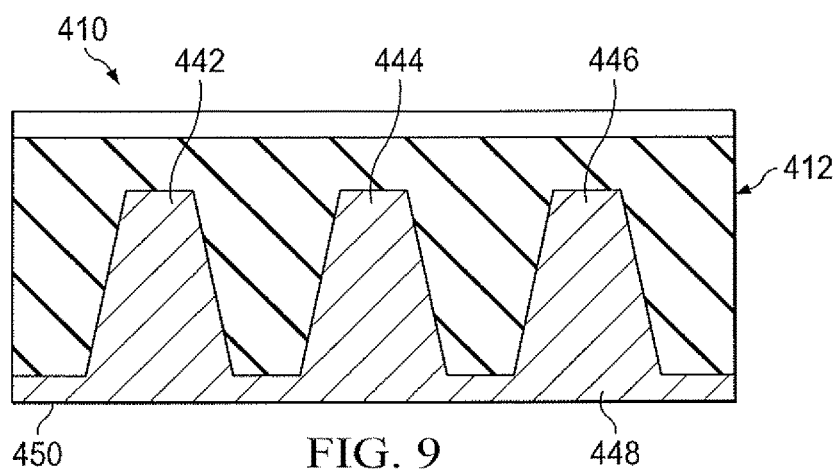
FIG. 9 is a cross-sectional elevation view of the IC die with integral heat sink of FIG. 8 in which heat sink voids are filled with thermally conductive material.

FIG. 9 is a cross-sectional elevation view of the IC die 410 after filling the void's with heat conductor material to form filled voids 442, 444, 446 which are connected by a thin lower block portion 448 having a bottom surface 450 that may be attached to a thermal substrate (not shown) to further improve heat transfer out of the metal layer 414.

FIG. 10 illustrates another IC die 460 having a semiconductor substrate 462 with a plurality of voids therein. The substrate 462 as a top surface 464 and a bottom surface 466 and an intermediate height portion 467. A metal circuit layer 468 is formed on the top surface 464. A plurality of narrow slots 470 extend from one longitudinal end of the substrate 462 to the other. With thin slots, e.g. slots having a width of less than about 200 µm, a dry etching process is generally used for slot formation. Ink jet printing may be used for placing thermally conductive material into such narrow slots 470. The slots extend upwardly from the bottom surface 466 to the intermediate height portion 467. The narrow slots 470 have a width of less than about 200 µm and may be formed with a dry etching process generally used for slot formation. Ink jet printing may be used for placing thermally conductive material into such narrow slots 470.

FIG. 11 is a cross-sectional elevation view of an IC die 472 with an integral heat sink, which includes two different thermally conductive materials. The die 472 includes a substrate 474 having a top surface 476 and a bottom surface 478. A plurality of voids define trapezoidal shaped interior sidewalls 482, 484, 486 extending upwardly from the bottom surface 478. A layer of a first thermally conductive material 488, for example graphite, graphene, diamond, zinc oxide, indium phosphide or metal, interfaces with each of the interior sidewalls 482, 484, 486. The empty space remaining in each void after the thermally conductive material 488 is applied is then filled with another thermally conductive material 490, for example thermal epoxy, metal or thermally conductive oxide. In each of the thermally conductive material fills described in this paragraph and other paragraphs, materials are selected that have a coefficient of thermal expansion (CTE) close to that of the semiconductor material, e.g., silicon, of the substrate. For example, the thermally conductive material may have a CTE that is plus or minus about 50% of the CTE of the semiconductor material. For example, in one embodiment, the CTE of the thermally conductive material differs from the CTE of the semiconductor material by less than 15%. The use of two or more thermally conductive materials as thermal fill materials may enable the combined CTE of the fill material to be more closely matched to that of the semiconductor material.

FIG. 12 is an isometric view of an IC die 512 having a semiconductor die 514 with heat sink slots 522, 524, 526, 528, 530, etc. These slots are filled with thermally conductive material, which extends outwardly from the IC die substrate 514 in a plurality of projections 521, 523, 525, 527, 529, etc. In this IC die 512 the slots may be two sets of parallel slots that intersect. The additional length of thermally conductive material extending from each slot increases the heat transfer properties of the semiconductor substrate 514. The IC die 512 in this embodiment may have an active metal circuit layer 532 on a top surface 534 thereof.

Figure 13:
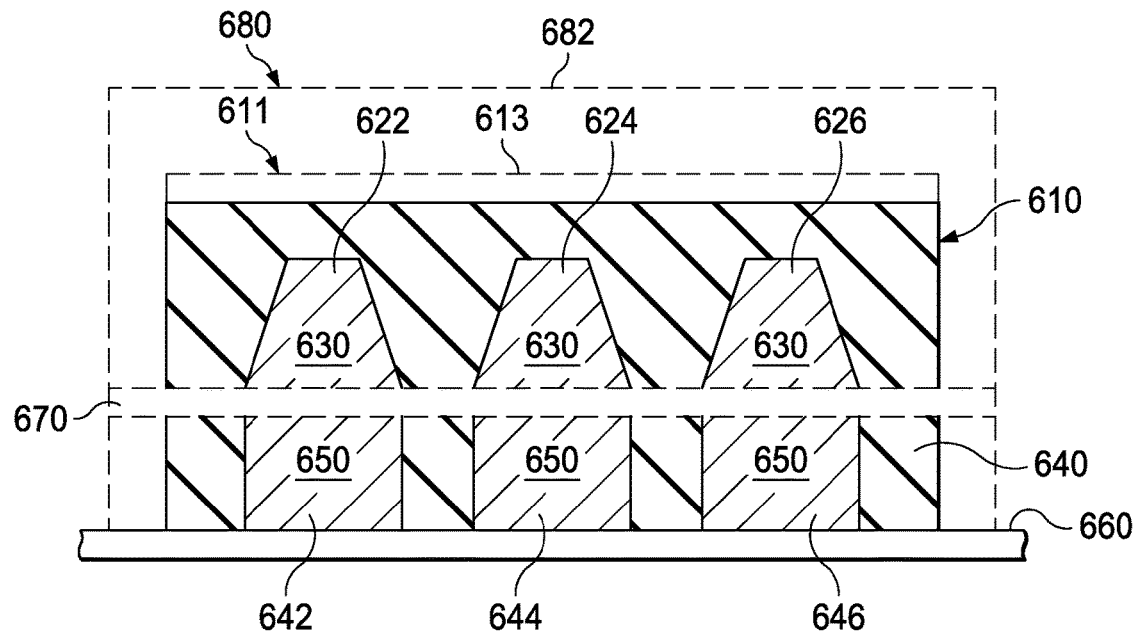
FIG. 13 is a cross-sectional side elevation view of an example embodiment of an IC die having thermally conductive material filled slots that is mounted on top of a substrate having filled through vias.

FIG. 13 is a cross-sectional side elevation view of an IC substrate 610 having slots 622, 624, 626 filled with thermally conductive material 630. The substrate 610 is mounted on top of another substrate 640 having through vias 642, 644, 646 filled with thermally conductive material 650. The slots and vias may be aligned such that a heat transfer pathway extends from each thermally conductive material filled slot, e.g., 622 to a corresponding thermally conductive material filled via, e.g., 642 to a bottom substrate 660 on which the substrate 640 is mounted. In one embodiment, an intermediate plate 670 made from thermally conductive material is positioned between the two substrates 610, 640 and provides an additional lateral heat transfer path. In one embodiment the substrate 610 is a portion of an IC die 611 having a circuit layer 613 positioned on top of the substrate 610. This IC die 611 may part of an IC package 680 having a layer of encapsulant 682. The plate 670 may be exposed through the layer of encapsulant 682 providing a heat transfer path out of the IC package 680. A second plate 660, to which the thermally conductive material 650 may be attached, may be a portion of a leadframe that is at least partially exposed at the bottom of the layer of encapsulant 680.

Figure 14:
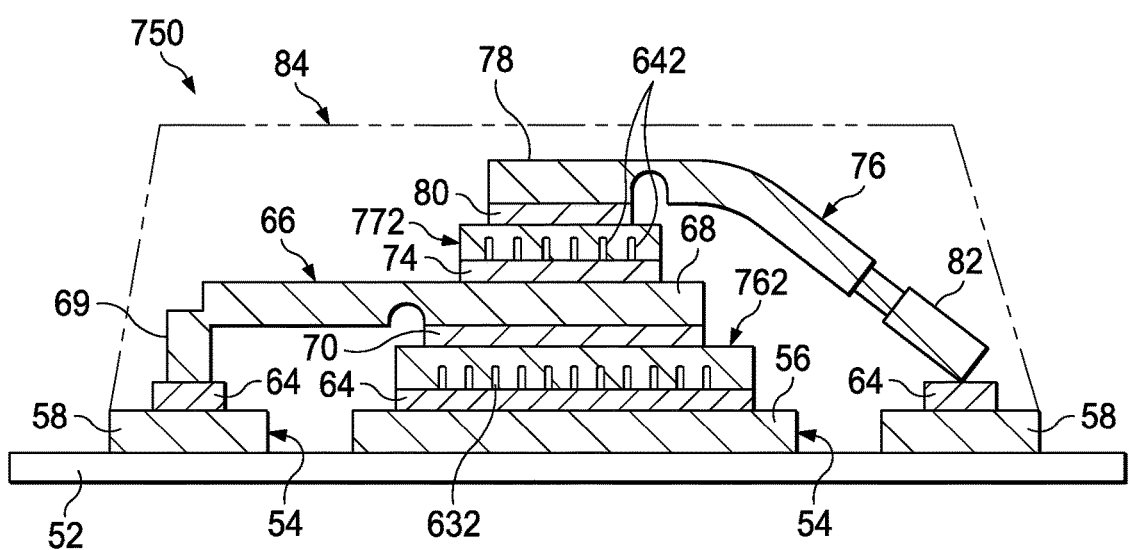
FIG. 14 is a cross-sectional elevation view of an example embodiment of an IC package with stacked IC dies that have integrally formed heat sinks.

FIG. 14 is a cross-sectional elevation view of an IC package 750 with stacked IC dies that have integrally formed heat sinks. The configuration of the IC package 750 may be identical to that of IC package 50 described in FIG. 2, except that the dies 762, 772 each have a plurality of slots 732, 742, respectively, formed in bottom portion. The slots 732, 742 facilitate heat transfer through each of the dies 762, 772 and thereafter out of the package. Other features of the IC die package have 700 series reference numerals that correspond to the 0 series numerals of FIG. 2

Figure 15:
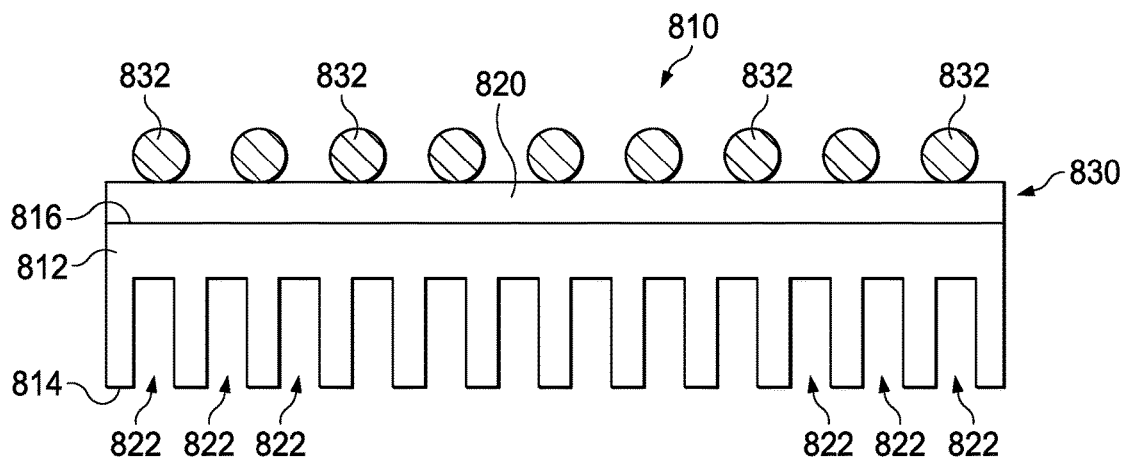
FIG. 15 is a cross-sectional side elevation view of an example embodiment of a flip chip die with an integrally formed heat sink formed with slots.

FIG. 15 is a side elevation view of a flip chip die 810 with an integrally formed heat sink. Flip chip die 810 has a semiconductor substrate 812 with a bottom surface 814 and a top surface 816. An active circuit layer 820 is formed on the top surface 816. Slots 822, which extend upwardly from the bottom surface 814, also extend longitudinally through the substrate 812. The active circuit layer 820 comprises a ball grid array 830 that includes a plurality of solder balls 832 or copper posts or similar electrical connectors located at a top portion of the active circuit layer 820.

Figure 16:
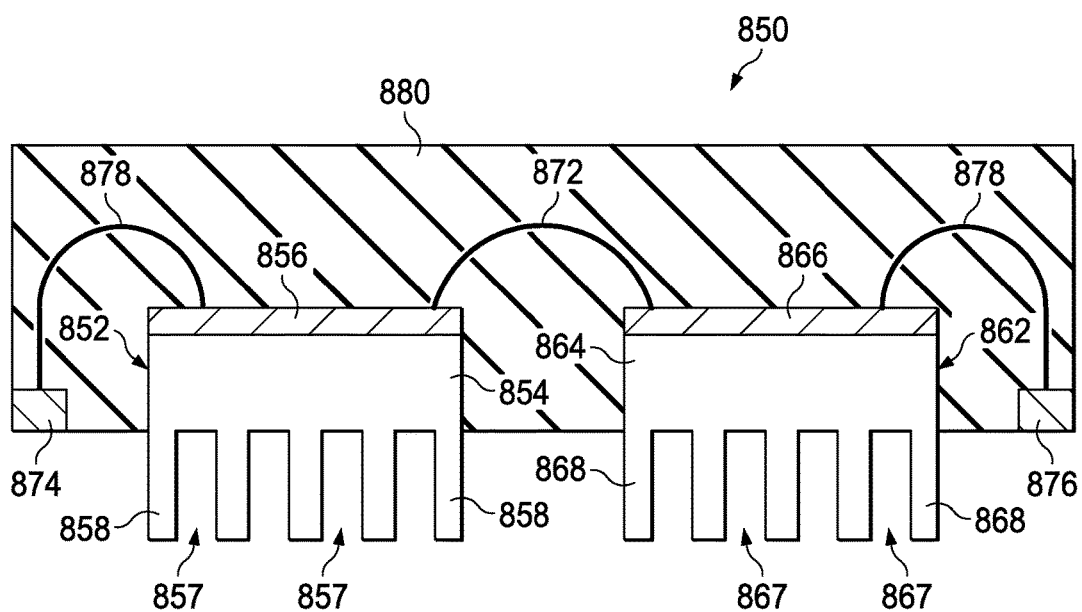
FIG. 16 is a cross-sectional side elevation view of an example embodiment of an IC package having a plurality of IC dies with integrally formed heat sinks in substrates thereof in which a heat sink portion of each substrate projects outside the package encapsulant.

FIG. 16 is a cross sectional side view of an IC package 850 that includes two IC dies 852, 862, each having a semiconductor substrate 854, 864, respectively and an active circuit layer 856, 866, respectively. The two circuit layers may be electrically connected by bond wires 872, etc. and may also be connected to leads 874, 876 by other bond wires 878. Each substrate may have a plurality of slots 857, 867 that define heat sink fins 858, 868, respectively. A layer of mold compound 880 may encapsulate the circuit layers 856, 866 and bond wires 872, 878, but leaves the fins 858, 868 exposed. The fins 858, 868 may dissipate heat by radiation. An airflow may be provided through slots 857, 867, etc. to increase heat dissipation form the IC package 850.

FIG. 17 illustrates a method of forming an integrated circuit die that comprises, as illustrated at block 910, etching at least one void in a substrate.

FIG. 18 illustrates another method of forming an integrated circuit device that comprises, as shown at block 920, etching at least one void in a substrate; and, as shown at block 922, at least partially filling the at least one void with thermally conductive material.

FIG. 19 illustrates another method of forming an integrated circuit device that comprises, as shown at block 932, etching at least one void in a substrate; and, as shown at block 934, Inkjet printing thermally conductive material in the at least one void.

Various embodiments of integrated circuit dies having heat sinks formed in semiconductor substrates thereof and integrated circuit packaging including such dies have been described in detail herein. Alternative embodiments of such integrated circuit dies and integrated circuit packages and method of making and using same may occur to those skilled in the art after reading this disclosure. It is intended that the language of the appended claims be construed broadly so as to cover all such alternative embodiments, except as limited by the prior art.

What is claimed is:

1. An integrated circuit package comprising:
   an integrated circuit device including a semiconductor substrate with a top surface, a bottom surface opposite said top surface, opposite first and second lateral side surfaces and opposite first and second longitudinal end surfaces, an intermediate portion positioned between said top and bottom surfaces and dividing said semiconductor substrate into upper and lower substrate portions, and interior surfaces defined by at least one void extending from said bottom surface to said intermediate portion and thermally conductive material interfacing with said interior surfaces; and
   an encapsulant encapsulating at least a portion of said substrate and a portion of said leadframe, wherein at least part of said lower substrate portion extends outwardly of said encapsulant.

2. The integrated circuit package of claim 1, further comprising thermally conductive material interfacing with said interior surfaces.

3. The integrated circuit package of claim 2 wherein said thermally conductive material comprises at least one of metal, graphite, grapheme, diamond, zinc oxide, indium phosphide, thermal epoxy and thermally conductive oxide.

4. The integrated circuit package of claim 2 wherein said thermally conductive material interfacing with said interior surfaces comprises a surface coating layer.

5. The integrated circuit package of claim 2 wherein said thermally conductive material interfacing with said interior surfaces at least partially fills said at least one void.

6. The integrated circuit package of claim 5 wherein said thermally conductive material completely fills said at least one void.

7. An integrated circuit device including a semiconductor substrate with a top surface, a bottom surface opposite said top surface, opposite first and second lateral side surfaces and opposite first and second longitudinal end surfaces, an intermediate portion positioned between said top and bottom surfaces and dividing said semiconductor substrate into upper and lower substrate portions, and interior surfaces defined by at least one void extending from said bottom surface to said intermediate portion and thermally conductive material interfacing with said interior surfaces; and
   wherein said thermally conductive material extends outwardly of at least one of said opposite first and second lateral side surfaces and opposite first and second longitudinal end surfaces of said substrate.

8. The device of claim 2 wherein said thermally conductive material is also an electrically conductive material.

9. The device of claim 2 wherein said thermally conductive material is an electrically nonconductive material.

10. The device of claim 1 wherein said at least one void is filled with fluid.

11. The device of claim 10 wherein said fluid filling said at least one void is moving within said at least one void.

12. The device of claim 10 wherein said fluid is air.

13. The device of claim 10 wherein said fluid is a liquid coolant.

14. The device of claim 2 further comprising a leadframe bonded to said thermally conductive material.

15. The device of claim 1, said device comprising a flip chip having solder balls attached to said top surface of said substrate.

16. An integrated circuit device comprising:
    a first semiconductor substrate with a top surface, a bottom surface opposite said top surface, an intermediate portion positioned between said top and bottom surfaces and interior surfaces defined by at least one void extending from said bottom surface to said intermediate portion;
    thermally conductive material interfacing with said interior surfaces of said first semiconductor substrate;
    a second substrate having a top surface and a bottom surface that is positioned in stacked relationship with said first substrate; and
    at least one filled via extending from said top surface to said bottom surface of said second substrate.

17. The device of claim 16 further comprising a leadframe on which one of said first and second substrates is mounted.

18. The device of claim 1 wherein said at least one void comprises a plurality of longitudinally extending channels and a plurality of laterally extending channels that intersect said plurality of longitudinally extending channels.

19. The device of claim 18 wherein said longitudinally extending channels extend through opposite lateral sidewalls of said semiconductor substrate.

20. The device of claim 2 wherein said thermally conductive material has a coefficient of thermal expansion ("CTE") approximately the same as that of the semiconductor material of the substrate.

21. The device of claim 20 wherein the CTE of the thermally conductive material differs from the CTE of the semiconductor material by less than 15%.

22. An integrated circuit package comprising:
    a lead frame comprising a die pad and a plurality of leads;
    a first semiconductor die substrate attached at a bottom surface thereof to said die pad, said first substrate having a plurality of laterally extending slots with openings of said slot located at said bottom surface of said first substrate;
    a first clip member attached at one end to a metal circuit layer on the top of said first die and on the other end to at least one of said plurality of leads;
    a second semiconductor die substrate attached at a bottom surface thereof to said first clip member, said second substrate having a plurality of slots extending laterally therethrough with openings of said slots located at said bottom surface of said second substrate, thermally conductive material at least partially filling said plurality of slots in said first die and said plurality of slots in said second die; and a second clip member attached at one end to a metal circuit layer on the top of said second die and on the other end to at least one of said plurality of leads and wherein said thermally conductive material has a coefficient of thermal expansion near that of said semiconductor material in the corresponding die.

23. The integrated circuit package of claim 22 wherein said thermally conductive material comprises at least two different thermally conductive materials.

24. The integrated circuit package of claim 22 wherein said first and second dies comprise first and second FETs, respectively.

* * * * *